US009368740B2

(12) United States Patent
Tang et al.

(10) Patent No.: US 9,368,740 B2
(45) Date of Patent: Jun. 14, 2016

(54) BLUE QUANTUM DOT COMPOSITE PARTICLE AND METHOD FOR PREPARING THE SAME, PHOTOELECTRIC ELEMENT, AND PHOTOELECTRIC DEVICE

(71) Applicant: BOE TECHNOLOGY GROUP CO., LTD., Beijing (CN)

(72) Inventors: Chen Tang, Beijing (CN); Jingxia Gu, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 14/310,637

(22) Filed: Jun. 20, 2014

(65) Prior Publication Data

US 2015/0279934 A1 Oct. 1, 2015

(30) Foreign Application Priority Data

Mar. 26, 2014 (CN) .......................... 2014 1 0116463

(51) Int. Cl.
*H01L 51/54* (2006.01)
*H01L 51/50* (2006.01)
*H01L 21/02* (2006.01)
*C09K 11/02* (2006.01)
*C09K 11/88* (2006.01)
*H01L 31/0352* (2006.01)
*C09K 11/54* (2006.01)
*B82Y 40/00* (2011.01)
*B82Y 20/00* (2011.01)

(52) U.S. Cl.
CPC ............ *H01L 51/502* (2013.01); *C09K 11/025* (2013.01); *C09K 11/54* (2013.01); *C09K 11/883* (2013.01); *H01L 21/02118* (2013.01); *H01L 21/02282* (2013.01); *H01L 21/02343* (2013.01); *H01L 21/02359* (2013.01); *H01L 31/035218* (2013.01); *B82Y 20/00* (2013.01); *B82Y 40/00* (2013.01); *Y10S 977/774* (2013.01); *Y10S 977/892* (2013.01); *Y10S 977/95* (2013.01)

(58) Field of Classification Search
CPC ..................... H01L 31/035218; H01L 31/502; C09K 11/54
See application file for complete search history.

(56) References Cited

U.S. PATENT DOCUMENTS 9,082,982 B2 * 7/2015 Jun et al.
9,248,441 B2 * 2/2016 Pinkhassik ............... A61K 9/50
(Continued)

FOREIGN PATENT DOCUMENTS

| CN | 1772835 | 5/2006 |
| CN | 102504822 | 6/2012 |
| CN | 102908961 | 2/2013 |

OTHER PUBLICATIONS

Office Action issued in corresponding Chinese Application No. 2014101164634 dated Mar. 25, 2015.
(Continued)

*Primary Examiner* — Allan R Wilson
(74) *Attorney, Agent, or Firm* — Baker Hostetler LLP

(57) ABSTRACT

The invention discloses a blue quantum dot composite particle, a photoelectric element and a photoelectric device. The blue quantum dot composite particle comprises a core and a shell that covers the core, wherein the core is a blue quantum dot, the shell is formed of a polymer, and the surface of the shell is chemically modified with gold nano-granules. The fluorescence efficiency of the blue quantum dot composite particle according to the invention is very high.

18 Claims, 1 Drawing Sheet

(56) References Cited

U.S. PATENT DOCUMENTS

| | | | |
|---|---|---|---|
| 9,267,889 B1* | 2/2016 | Klopfer | G01N 21/6428 |
| 2008/0011977 A1* | 1/2008 | Atwood | 252/62.51 R |
| 2011/0068321 A1* | 3/2011 | Pickett et al. | 257/13 |
| 2011/0084250 A1* | 4/2011 | Jang et al. | 257/14 |
| 2011/0206619 A1* | 8/2011 | Mahmoudi et al. | 424/9.323 |
| 2012/0202218 A1* | 8/2012 | Liedberg et al. | 435/7.4 |
| 2013/0099213 A1* | 4/2013 | Jun et al. | 257/40 |
| 2013/0195755 A1* | 8/2013 | Poselt et al. | 424/1.29 |
| 2014/0234226 A1* | 8/2014 | Mahmoudi et al. | 424/9.323 |
| 2015/0037818 A1* | 2/2015 | Huang et al. | 435/7.23 |

OTHER PUBLICATIONS

Fu et al., "Silver-enhanced fluorescence emission of single quantum dot nanocomposites", Chemical Communications, pp. 313-315, The Royal Society of Chemistry 2009.

* cited by examiner

BLUE QUANTUM DOT COMPOSITE PARTICLE AND METHOD FOR PREPARING THE SAME, PHOTOELECTRIC ELEMENT, AND PHOTOELECTRIC DEVICE

CROSS REFERENCE OF THE RELATED APPLICATION

The present application claims priority to the Chinese application No. 201410116463.4 filed on Mar. 26, 2014, entitled with "Blue Quantum Composite Particle and Method for Preparing the Same, Photoelectric Element, and Photoelectric Device", the entire contents of which are incorporated herein by reference.

FIELD OF THE INVENTION

The present invention relates to the field of quantum dot technologies, and in particular, to a blue quantum dot composite particle and a method for preparing the same, a photoelectric element, and a photoelectric device.

DESCRIPTION OF THE PRIOR ART

Quantum dot is also referred to as semiconductor nanocrystal, which is a novel fluorescent nano-material. In comparison with traditional organic fluorescent dyes, quantum dot has many advantages, for example, a very wide excitation spectrum, a narrow and symmetrical emission spectrum and a high fluorescence intensity, etc. due to these advantages, quantum dot takes a very important role in the display field. At present, during the practical application, the most significant problem is that blue quantum dot has a low luminescence purity and a short luminescence life and its fluorescence radiation efficiency still needs to be improved.

SUMMARY OF THE INVENTION

It is an object of the invention to provide a blue quantum dot composite particle with high fluorescence radiation efficiency, and a photoelectric element and a photoelectric device both of which comprise the photoelectric element.

According to an embodiment of the present invention, the present invention provides a blue quantum dot composite particle which has a core and a shell that covers the core, wherein the core is a blue quantum dot, the shell is formed of a polymer, and the surface of the shell is chemically modified with gold nano-granules.

According to another embodiment of the present invention, the thickness of the shell is in the range from 5 to 30 nm.

According to still another embodiment of the present invention, the grain size of the gold nano-granules is in the range from 3 to 10 nm.

According to still another embodiment of the present invention, the modification degree of the gold nano-granules in the blue quantum dot composite particle is that the surface of one blue quantum dot is modified with 2-3 gold nano-granules on average.

According to still another embodiment of the present invention, the monomer of the polymer is at least one selected from methyl methacrylate, methyl acrylate, ethyl acrylate and butyl acrylate.

According to still another embodiment of the present invention, the blue quantum dot is consisted of a compound of II-VI group elements or a compound of III-V group elements.

According to an embodiment of the present invention, the present invention provides a method for preparing a blue quantum dot composite particle, which comprises:
coating a polymer on the surface of a blue quantum dot via seed emulsion polymerization;
modifying the polymer via hydrolysis so as to make the surface thereof have a carboxyl functional group; and
combining a gold nano-granule having an amino functional group on its surface with a blue quantum dot having a carboxyl functional group on its surface via chemical coupling, and obtaining a blue quantum dot composite particle.

According to another embodiment of the present invention, the thickness of the shell is in the range from 5 to 30 nm.

According to still another embodiment of the present invention, the grain size of the gold nano-granule is in the range from 3 to 10 nm.

According to another embodiment of the present invention, the monomer of the polymer is at least one selected from methyl methacrylate, methyl acrylate, ethyl acrylate and butyl acrylate.

According to an embodiment of the present invention, the present invention provides a photoelectric element, which comprises the blue quantum dot composite particle described above.

According to an embodiment of the present invention, the present invention provides a photoelectric device, which comprises the photoelectric element described above.

The fluorescence efficiency of the blue quantum dot composite particle according to the invention is very high. Moreover, the method for preparing a blue quantum dot composite particle according to the invention has a simple process and a good controllability.

DETAILED DESCRIPTION OF THE PREFERRED EMBODIMENTS

Figure 1:
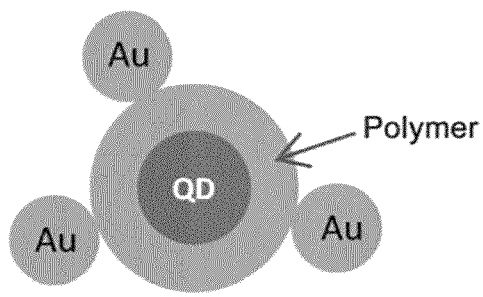
FIG. 1 shows a structural representation of a blue quantum dot composite particle according to an embodiment of the present invention.

According to an embodiment of the invention, the present invention provides a blue quantum dot composite particle, which has a core and a shell that covers the core, wherein the core is a blue quantum dot, the shell is formed of a polymer, and the surface of the shell is chemically modified with gold nano-granules.

Metal reinforced fluorescence phenomenon refers to that the plasma resonance action inside a metal nano-granule may remarkably reinforce the fluorescence intensity of a fluorescent material near the surface of the metal nano-granule.

In an embodiments of the invention, a gold nano-granule can be made to appear in the range of the fluorophore radiation energy of a blue quantum dot, so that the plasma resonance electromagnetic field of the gold nano-granule may change the attenuation rate of fluorescence of a radiation medium around it, thereby increasing the degree of resonance energy transfer. When a fluorescent material is placed adjacent to a gold nano-granule at an appropriate distance, the existence of the gold nano-granule will cause the increase of the total radiation attenuation rate of the fluorescent material, so that the fluorescent quantum yield of the fluorophore will be improved.

In an embodiment of the invention, by controlling the thickness of a shell that is formed of a polymer, the blue quantum dot and the gold nano-granule may be kept at an appropriate distance, so that the gold nano-granule appears in the range of the fluorophore radiation energy, thereby the fluorescent quantum yield of the fluorophore will be improved.

According to an embodiment of the invention, the thickness of the polymer layer is in the range from 5 to 30 nm, preferably in the range from 8 to 20 nm, and more preferably in the range from 8.5 to 16.2 nm.

The monomer of the polymer may be at least one selected from methyl methacrylate, methyl acrylate, ethyl acrylate and butyl acrylate.

According to an embodiment of the invention, the blue quantum dot is a quantum dot with an emission wavelength of 425-470 nm, and it is consisted of a compound of II-VI group elements and a compound of III-V group elements. For example, the blue quantum dot is CdSe quantum dot, CdSe/ZnS core-shell quantum dot or ZnCdS alloy quantum dot with an emission wavelength of 430-460 nm.

According to an embodiment of the invention, the grain size of the gold nano-granule is in the range from 3 to 10 nm.

According to an embodiment of the invention, the modification degree of the gold nano-granule in the blue quantum dot composite particle is that the surface of one blue quantum dot is modified with 2-3 gold nano-granules on average.

According to an embodiment of the invention, the modification degree of the gold nano-granule is controlled by a mole ratio of the blue quantum dot to the gold nano-granule. By adjusting the mole ratio of the blue quantum dot to the gold nano-granule, the surface of one blue quantum dot may be modified with 2-3 gold nano-granules on average. The result may be verified via a high-resolution transmission electron microscope.

According to an embodiment of the invention, the present invention provides a method for preparing a blue quantum dot composite particle which includes:

coating a polymer on the surface of a blue quantum dot via a seed emulsion polymerization;

modifying the polymer via hydrolysis so as to make the surface thereof have a carboxyl functional group; and combining a gold nano-granule having an amino functioned group on its surface with a blue quantum dot having a carboxyl functional group on its surface via chemical coupling, and obtaining a blue quantum dot composite particle.

The method for preparing a blue quantum dot composite particle according to embodiments of the invention has a simple process and a good controllability.

According to an embodiment of the invention, the thickness of the shell is in the range from 5 to 30 nm, preferably in the range from 8 to 20 nm, and more preferably in the range from 8.5 to 16.2 nm.

In an embodiment of the invention, the thickness of the shell may be controlled by adjusting the mass of the monomer added dropwise, so that the blue quantum dot and the gold nano-granule may be kept at an appropriate distance.

According to an embodiment of the invention, the monomer of the polymer may be at least one selected from methyl methacrylate, methyl acrylate, ethyl acrylate and butyl acrylate.

According to an embodiment of the invention, the blue quantum dot is a quantum dot with an emission wavelength of 425-470 nm, and it is consisted of a compound of II-VI group elements and a compound of III-V group elements. For example, the blue quantum dot is CdSe quantum dot, CdSe/ZnS core-shell quantum dot or ZnCdS alloy quantum dot with an emission wavelength of 430-460 nm.

According to an embodiment of the invention, the grain size of the gold nano-granule is in the range from 3 to 10 nm.

A gold nano-granule modified with a amino functional group, which is used in the method of the present invention, may be prepared by a method of the prior art, for example, a method as described in the following:

First of all, 5 ml aqueous solution of chlorauric acid with a mass fraction of 1% is added into 500 ml water, and then 2 ml aqueous solution of chitosan with a mass fraction of 1% is added; after being stirred at room temperature for 10 minutes, 0.75 ml aqueous solution of sodium borohydride with a mass fraction of 0.075% is added thereto, then it continues to be stirred for 2 hours, and a gold nano-granule modified with a amino functional group will be obtained.

According to another embodiment of the invention, the present invention further provides a photoelectric element including the above blue quantum dot composite particle. The photoelectric element may be quantum dot film color film, backlight source, sheet polarizer, luminescent layer and photoelectric converting device, etc.

According to still another embodiment of the invention, the present invention further provides a photoelectric device, which includes the above photoelectric element that utilizes the blue quantum dot composite particle. The photoelectric device may be any product or component that has a lighting or display function, for example, lighting device, liquid crystal display panel, electronic paper, organic electroluminescent display (OLED) panel, mobile phone, tablet computer, TV set, display, notebook computer, digital photo frame and navigator, etc.

Optionally, the blue quantum dot composite particle has an electroluminescent performance, and it may be employed to manufacture a photoelectric converting device.

That is, the above blue quantum dot composite particle may be applied to manufacture a quantum dot film, or even a color film or a backlight source in a liquid crystal display device. For example, the blue quantum dot composite particle may be applied to manufacture a blue color film. Of course, a white light may also be formed by mixing the light emitted by the blue quantum dot composite particle with lights of other colors and function as a light source of the backlight source in a liquid crystal display device.

Optionally, the above blue quantum dot composite particle may also be applied to manufacture a luminescent layer in an OLED device, and a luminescent layer that emits a blue light may be manufactured by the blue quantum dot composite particle.

Or, the above blue quantum dot composite particle may also be applied to manufacture a lighting device. For example, it may be doped with various quantum dot composite particles that emit various lights, so as to finally composite a material that emits a white light, which will be used for lighting.

The present invention will be further illustrated below in conjunction with specific examples, which are only used for illustrating the present invention, rather than limiting the scope thereof.

Example 1

0.1 g CdSe is diluted and dispersed in 15 g water uniformly via ultrasonic dispersion to obtain a seed system. 0.05 g monomer of methyl methacrylate, 0.05 g emulsifier of sodium dodecanesulphonate, 0.05 g aqueous solution of potassium persulphate (as an initiator) with a mass percentage concentration of 1% and 5 g water are mixed via ultrasonic emulsification to obtain an emulsion system. The above seed solution is heated to 80° C., and then the above emulsion system is added dropwise to the seed solution, wherein the dropwise adding rate is 0.1 ml/min, and the temperature is kept for 4 hours after adding. After the reaction is completed, the product is washed via centrifugation with water, and a polymer-coated blue quantum dot is obtained. The result of a high-resolution transmission electron microscope shows that, at this time, the average thickness of the polymer layer is about 8.5 nm.

1 g polymer-coated blue quantum dot is dispersed in 100 g aqueous solution of sodium hydroxide with a mass percentage concentration of 5%, then it is heated to reflux reaction for 24 hours. Then the reaction system is adjusted to neutrality via a hydrochloric acid solution with a mass percentage concentration of 10%; and the product is washed via centrifugation with water, and a blue quantum dot of which the surface is modified with a carboxyl functional group is obtained.

1 g blue quantum dot of which the surface is modified with a carboxyl functional group is dispersed in 50 g water and stirred violently. Then ammonia water is added until the pH value of the solution rises to 7.0, and then 50 μL 0.2M PBS buffer solution is added to stabilize the pH value. Next, 3 g gold nano-granules (with a grain size of 3 nm) of which the surface is modified with an amino functional group and an aqueous solution that contains $6 \times 10^{-5}$ g 1-(3-dimethylaminopropyl)-3-ethyl carbodiimide hydrochloride (EDC) are added, and it continues to react at room temperature for 30 minutes, and a blue quantum dot composite particle is obtained.

Example 2

0.1 g CdSe is dispersed in 15 g water uniformly via ultrasonic dispersion to obtain a seed system. 0.1 g monomer of methyl methacrylate, 0.05 g emulsifier of sodium dodecanesulphonate, 0.05 g aqueous solution of potassium persulphate (as an initiator) with a mass percentage concentration of 1% and 5 g water are mixed via ultrasonic emulsification to obtain an emulsion system. The above seed solution is heated to 80° C., and then the above emulsion system is added dropwise, wherein the dropwise adding rate is 0.1 ml/min, and the temperature is kept for 4 h after adding. After the reaction is completed, the product is washed via centrifugation with water, and a polymer-coated blue quantum dot is obtained. The result of a high-resolution transmission electron microscope shows that, at this time, the thickness of the polymer layer is about 16.2 nm.

1 g polymer-coated blue quantum dot is dispersed in 100 g aqueous solution of sodium hydroxide with a mass percentage concentration of 5%, then it is heated to reflux reaction for 24 hours. Then the reaction system is adjusted to neutrality via a hydrochloric acid solution with a mass percentage concentration of 10%. The product is washed via centrifugation with water, and a blue quantum dot of which the surface is modified with a carboxyl functional group is obtained.

1 g blue quantum dot of which the surface is modified with a carboxyl functional group is dispersed in 50 g water and stirred violently. Then ammonia water is added until the pH value of the solution rises to 7.0, and then 50 μL 0.2M PBS buffer solution is added to stabilize the pH value. Next, 3 g nano-granules (with a grain size of 10 nm) of which the surface is modified with an amino functional group and an aqueous solution that contains $6 \times 10^{-5}$ g 1-(3-dimethylaminopropyl)-3-ethyl carbodiimide hydrochloride (EDC) are added, and it continues to react at room temperature for 30 minutes, and a blue quantum dot composite particle is obtained.

Example 3

0.1 g CdSe is diluted and dispersed in 15 g water uniformly via ultrasonic dispersion to obtain a seed system. 0.03 g monomer of methyl methacrylate, 0.05 emulsifier of sodium dodecanesulphonate, 0.05 g aqueous solution of potassium persulphate (as an initiator) with a mass percentage concentration of 1% and 5 g water are mixed via ultrasonic emulsification to obtain an emulsion system. The above seed solution is heated to 80° C., and then the above emulsion system is added dropwise to the seed solution, wherein the dropwise adding rate is 0.1 ml/min, and the temperature is kept for 4 hours after adding. After the reaction is completed, the product is washed via centrifugation with water, and a polymer-coated blue quantum dot is obtained. The result of a high-resolution transmission electron microscope shows that, at this time, the average thickness of the polymer layer is about 5 nm.

1 g polymer-coated blue quantum dot is dispersed in 100 g aqueous solution of sodium hydroxide with a mass percentage concentration of 5%, and then it is heated to reflux reaction for 24 hours. Then the reaction system is adjusted to neutrality via a hydrochloric acid solution with a mass percentage concentration of 10%; the product is washed via centrifugation with water, and a blue quantum dot of which the surface is modified with a carboxyl functional group is obtained.

1 g blue quantum dot of which the surface is modified with a carboxyl functional group is dispersed in 50 g water and stirred violently. Then ammonia water is added until the pH value of the solution rises to 7.0, and then 50 μL, and then 50 μL 0.2M PBS buffer solution is added to stabilize the pH value. Next, 3 g gold nano-granules (with a grain size of 3 nm) of which the surface is modified with an amino functional group and an aqueous solution that contains $6 \times 10^{-5}$ g 1-(3-dimethylaminopropyl)-3-ethyl carbodiimide hydrochloride (EDC) are added, and it continues to react at room temperature for 30 minutes, and a blue quantum dot composite particle is obtained.

Example 4

0.1 g CdSe is diluted and dispersed in 15 g water uniformly via ultrasonic dispersion to obtain a seed system. 0.2 g monomer of methyl acrylate, 0.05 g emulsifier of sodium dodecanesulphonate, 0.05 g aqueous solution of potassium persulphate (as an initiator) with a mass percentage concentration of 1% and 5 g water are mixed via ultrasonic emulsification to obtain an emulsion system. The above seed solution is heated to 80° C., and then the above emulsion system is added dropwise to the seed solution, wherein the dropwise adding rate is 0.1 ml/min, and the temperature is kept for 4 hours after adding. After the reaction is completed, the product is washed via centrifugation with water, and a polymer-coated blue quantum dot is obtained. The result of a high-resolution transmission electron microscope shows that, at this time, the average thickness of the polymer layer is about 30 nm.

1 g polymer-coated blue quantum dot is dispersed in 100 g aqueous solution of sodium hydroxide with a mass percentage concentration of 5%, then it is heated to reflux reaction for 24 hours. Then the reaction system is adjusted to neutrality via a hydrochloric acid solution with a mass percentage concentration of 10%; the product is washed via centrifugation with water, and a blue quantum dot of which the surface is modified with a carboxyl functional group is obtained.

1 g blue quantum dot of which the surface is modified with a carboxyl functional group is dispersed in 50 g water and stirred violently. Then ammonia water is added until the pH value of the solution rises to 7.0, and then 50 μL 0.2M PBS buffer solution is added to stabilize the pH value. Next, 3 g gold nano-granules (with a grain size of 3 nm) of which the surface is modified with an amino functional group and an aqueous solution that contains $6\times10^{-5}$ g 1-(3-dimethylaminopropyl)-3-ethyl carbodiimide hydrochloride (EDC) are added, and it continues to react at room temperature for 30 min, and a blue quantum dot composite particle is obtained.

Determination of Fluorescence Efficiency

Fluorescence efficiency refers to the percentage by which a fluorescent molecule transforms the optical energy absorbed into fluorescence, which is in direct proportion to the numerical value of the light quantum of the emitted fluorescence (emitted fluorescence intensity). Therefore, in this specification, the fluorescence efficiencies of the blue quantum dot composite particles and the blue quantum dots prepared in Examples 1-4 are compared by determining the emitted fluorescence intensity.

In the case that the wavelength and the intensity of an excitation light keep constant, the fluorescence emitted by the blue quantum dot composite particles prepared in Examples 1-4 is irradiated on a detector after passing through an emission monochromator, and fluorescence emission spectrums of the blue quantum dot composite particles prepared in Examples 1-4 are obtained by drawing a coordinate graph that takes the fluorescence wavelength as the horizontal coordinate and takes the emitted fluorescence intensity as the longitudinal coordinate.

Figure 2:
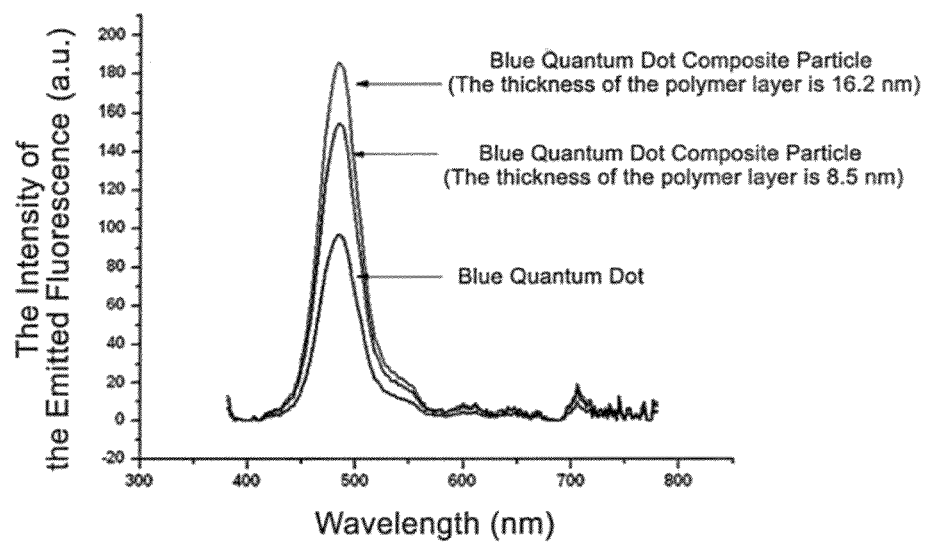
FIG. 2 shows the fluorescence emission spectrograms of a blue quantum dot and two kinds of blue quantum dot composite particles according to Examples 1-2.

FIG. 2 shows the fluorescence emission spectrums of the prior blue quantum dot composite particles according to Examples 1-2 and the prior blue quantum dots. It can be seen from the fluorescence emission spectrum of the blue quantum dot composite particles prepared in Examples 1-2 that, under the same excitation light, the intensity of the emitted fluorescence of the blue quantum dot composite particles prepared in Examples 1-2 is larger than the emitted fluorescence intensity of the prior blue quantum dot. Therefore, the fluorescence efficiency of the blue quantum dot composite particles prepared in Examples 1-2 is higher than that of the blue quantum dot.

Similarly, for the blue quantum dot composite particles prepared in Examples 3-4, they have higher emitted fluorescence intensity than the blue quantum dot. Therefore, they also have higher fluorescence efficiency than the blue quantum dot. No fluorescence emission spectrum of the blue quantum dot composite particles according to Examples 3-4 is shown in this specification.

The above embodiments or examples are only used for illustrating the invention, rather than limiting the scope of the invention. Various variations and modifications may also be made by one skilled in the art without departing from the spirit and scope of the invention. Therefore, all equivalent technical solutions pertain to the scope of the invention, and the protection scope of the invention should be defined by the appended claims.

What is claimed is:

1. A blue quantum dot composite particle having a core and a shell that covers the core, wherein the core is a blue quantum dot, the shell is formed of a polymer, and the surface of the shell is chemically modified with gold nano-granules, and wherein the thickness of the shell is in the range of from 5 nm to 30 nm.

2. The blue quantum dot composite particle according to claim 1, wherein the grain size of the gold nano-granules is in the range from 3 nm to 10 nm.

3. The blue quantum dot composite particle according to claim 1, wherein the modification degree of the gold nano-granules in the blue quantum dot composite particle is that the surface of one blue quantum dot is modified with 2-3 gold nano-granules on average.

4. The blue quantum dot composite particle according to claim 1, wherein the modification degree of the gold nano-granules in the blue quantum dot composite particle is that the surface of one blue quantum dot is modified with 2-3 gold nano-granules on average.

5. The blue quantum dot composite particle according to claim 2, wherein the modification degree of the gold nano-granules in the blue quantum dot composite particle is that the surface of one blue quantum dot is modified with 2-3 gold nano-granules on average.

6. The blue quantum dot composite particle according to claim 1, wherein the monomer of the polymer is at least one selected from methyl methacrylate, methyl acrylate, ethyl acrylate and butyl acrylate.

7. The blue quantum dot composite particle according to claim 1, wherein the monomer of the polymer is at least one selected from methyl methacrylate, methyl acrylate, ethyl acrylate and butyl acrylate.

8. The blue quantum dot composite particle according to claim 2, wherein the monomer of the polymer is at least one selected from methyl methacrylate, methyl acrylate, ethyl acrylate and butyl acrylate.

9. The blue quantum dot composite particle according to claim 1, wherein the blue quantum dot consists of a compound selected from the II-VI group elements and a compound selected from the III-V group elements.

10. The blue quantum dot composite particle according to claim 1, wherein the blue quantum dot consists of a compound selected from the II-VI group elements and a compound selected from the III-V group elements.

11. The blue quantum dot composite particle according to claim 2, wherein the blue quantum dot consists of a compound selected from the II-VI group elements and a compound selected from the III-V group elements.

12. A photoelectric element, comprising the blue quantum dot composite particle according to claim 1.

13. A method for preparing a blue quantum dot composite particle having a core and a shell that covers the core, wherein the core is a blue quantum dot, the shell is formed of a polymer, and the surface of the shell is chemically modified with gold nano-granules, and wherein the thickness of the shell is in the range from 5 nm to 30 nm, the method comprising:
    coating a polymer on the surface of a blue quantum dot via seed emulsion polymerization;
    modifying the polymer via hydrolysis so as to make the surface thereof have a carboxyl functional group; and
    combining gold nano-granules having an amino functional group on its surface with a blue quantum dot having a carboxyl functional group on its surface via chemical coupling, and obtaining the blue quantum dot composite particle.

14. The method according to claim 13, wherein the thickness of the polymer coated on the surface of the blue quantum dot is in the range from 5 nm to 30 nm.

15. The method according to claim 13, wherein the grain size of the gold nano-granule is in the range from 3 nm to 10 nm.

16. The method according to claim 13, wherein the monomer of the polymer is at least one selected from methyl methacrylate, methyl acrylate, ethyl acrylate and butyl acrylate.

17. The method according to claim 14, wherein the monomer of the polymer is at least one selected from methyl methacrylate, methyl acrylate, ethyl acrylate and butyl acrylate.

18. The method according to claim 15, wherein the monomer of the polymer is at least one selected from methyl methacrylate, methyl acrylate, ethyl acrylate and butyl acrylate.

\* \* \* \* \*